United States Patent
Huang

(10) Patent No.: US 11,984,366 B2
(45) Date of Patent: May 14, 2024

(54) MEASUREMENT DEVICE AND METHOD FOR SEMICONDUCTOR STRUCTURE

(71) Applicant: CHANGXIN MEMORY TECHNOLOGIES, INC., Hefei (CN)

(72) Inventor: Xin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 331 days.

(21) Appl. No.: 17/509,126

(22) Filed: Oct. 25, 2021

(65) Prior Publication Data
US 2023/0024724 A1    Jan. 26, 2023

Related U.S. Application Data

(63) Continuation of application No. PCT/CN2021/117062, filed on Sep. 8, 2021.

(30) Foreign Application Priority Data

Jul. 22, 2021    (CN) .......................... 202110832798.6

(51) Int. Cl.
*G01N 21/88*    (2006.01)
*G01N 21/95*    (2006.01)
(Continued)

(52) U.S. Cl.
CPC ......... *H01L 22/12* (2013.01); *G01N 21/8851* (2013.01); *G01N 21/9501* (2013.01); *H01L 21/68728* (2013.01)

(58) Field of Classification Search
CPC ............... H01L 22/12; H01L 21/67242; H01L 21/68728; H01L 21/68785; H01L 21/67;
(Continued)

(56) References Cited

U.S. PATENT DOCUMENTS 5,617,643 A * 4/1997 Kato .................... G01B 5/285
356/600
5,642,298 A * 6/1997 Mallory .................. H01L 22/20
414/941
(Continued)

FOREIGN PATENT DOCUMENTS

CN    101881599 A    11/2010
CN    208514344 U    2/2019
(Continued)

OTHER PUBLICATIONS

English translation of JP-2004151102-A, published May 27, 2004. (Year: 2004).*
(Continued)

*Primary Examiner* — Christina A Riddle
(74) *Attorney, Agent, or Firm* — Cooper Legal Group, LLC

(57) ABSTRACT

A measurement device and method for a semiconductor structure are provided. The measurement device for the semiconductor structure includes a bearing platform, a clamping mechanism, and an image acquisition system. The clamping mechanism is installed on the bearing platform and includes a clamp disposed along a vertical direction. The clamp is configured to clamp the semiconductor structure such that the semiconductor structure is clamped with a to-be-measured surface facing a side. The image acquisition system is disposed by a side of the clamping mechanism, and is configured to acquire a three-dimensional morphology of the semiconductor structure from the side.

14 Claims, 20 Drawing Sheets

(51) Int. Cl.
*H01L 21/66* (2006.01)
*H01L 21/687* (2006.01)

(58) Field of Classification Search
CPC ..... H01L 21/68; H01L 21/681; H01L 21/683; H01L 21/67253; H01L 21/67259; H01L 21/67288; H01L 21/67313; H01L 21/67326; H01L 21/67346; H01L 21/67718; H01L 21/6835; H01L 21/6838; H01L 21/687; H01L 21/68714; H01L 21/68721; H01L 21/68735; H01L 21/6875; G01N 21/8851; G01N 21/95; G01N 21/9501–9505; G01N 21/898; G01N 21/956–95607; G01N 21/95623; G01N 21/95684; G01N 21/95692; G01N 2021/8854–8896; G01N 2021/95615; G01N 2021/9563; G03F 7/70; G03F 7/70483; G03F 7/705; G03F 7/70605–706851; G03F 7/70691; G03F 7/707; G03F 7/70708; G03F 7/70733; G03F 7/7075; G03F 7/70783; G03F 7/70791; G03F 7/708; G03F 7/70808; G03F 7/70825; G03F 7/70841; G01B 11/002; G01B 11/00; G01B 11/02–0608; G01B 11/0691; G01B 11/24; G01B 11/2408; G01B 11/245; G01B 11/25; G01B 11/255; G01B 11/26; G01B 11/27; G01B 11/272; G01B 11/28; G01B 11/30–306
USPC ..... 355/18, 30, 52–55, 67–77; 356/399–401, 356/237.1–237.6
See application file for complete search history.

(56) References Cited

U.S. PATENT DOCUMENTS

| | | | |
|---|---|---|---|
| 5,988,971 A * | 11/1999 | Fossey | H01L 21/67778 414/941 |
| 6,367,159 B1 * | 4/2002 | Naoi | G01B 21/08 33/554 |
| 10,281,412 B2 | 5/2019 | Leem | |
| 2002/0072134 A1 * | 6/2002 | Ha | G01B 11/06 356/485 |
| 2011/0128371 A1 * | 6/2011 | Gastaldo | G01N 21/9501 348/126 |
| 2017/0102343 A1 | 4/2017 | Leem et al. | |

FOREIGN PATENT DOCUMENTS

| | | | | |
|---|---|---|---|---|
| CN | 111146107 A | | 5/2020 | |
| CN | 111211064 A | | 5/2020 | |
| CN | 111811459 A | | 10/2020 | |
| CN | 111816603 A | | 10/2020 | |
| CN | 112372552 A | * | 2/2021 | ............ B25B 11/00 |
| CN | 112372552 A | | 2/2021 | |
| CN | 112992749 A | | 6/2021 | |
| CN | 114420581 A | * | 4/2022 | ............ H01L 21/683 |
| JP | 2004151102 A | * | 5/2004 | |
| TW | 200821772 A | | 5/2008 | |
| TW | 201629431 A | | 8/2016 | |
| TW | 201908873 A | | 3/2019 | |

OTHER PUBLICATIONS

English translation of CN-112372552-A, published Feb. 19, 2021. (Year: 2021).*
English translation of CN-114420581-A (Year: 2022).*

* cited by examiner

US 11,984,366 B2

MEASUREMENT DEVICE AND METHOD FOR SEMICONDUCTOR STRUCTURE

CROSS-REFERENCE TO RELATED APPLICATIONS

The present application is a U.S. continuation application of International Application No. PCT/CN2021/117062, filed on Sep. 8, 2021, which claims priority to Chinese Patent Application No. 202110832798.6, filed on Jul. 22, 2021. International Application No. PCT/CN2021/117062 and Chinese Patent Application No. 202110832798.6 are incorporated herein by reference in their entireties.

TECHNICAL FIELD

The disclosure relates to the technical field of semiconductor integrated circuit manufacturing, and in particular, to a measurement device and method for a semiconductor structure.

BACKGROUND

With the development of the semiconductor industry, a line width of an integrated circuit is shrinking, and a structural design of the integrated circuit device becomes more and more complicated. Process control needs to be very strict to achieve a fully functional circuit and a semiconductor device working at a high speed.

Currently, an Optical Critical Dimension (OCD) measurement technology is an important part of advanced process control in the current semiconductor manufacturing process. It can measure and analyze a three-dimensional morphology of a to-be-measured surface of a semiconductor structure. The basic working principle of the OCD measurement technology may be described as follows: (1) a theoretical spectrum corresponding to the three-dimensional morphology of the to-be-measured surface of the semiconductor structure is obtained by fitting based on a model; (2) a measured spectrum of the to-be-measured surface of the semiconductor structure is obtained by an OCD measurement device; and (3) parameters of the model are adjusted so that the aforesaid theoretical spectrum obtained by fitting is coupled and matched with the measured spectrum to obtain optimal parameters, so as to determine the three-dimensional morphology of the to-be-measured surface of the semiconductor structure based on the optimal parameters.

However, with the development of the semiconductor technology, a semiconductor structure to be measured becomes more and more complicated, which leads to higher requirements for measurement accuracy in the process control. Therefore, how to improve the measurement accuracy of the semiconductor structure is a technical problem that needs to be solved urgently at present.

SUMMARY

Some embodiments of the disclosure provide a measurement device for a semiconductor structure. The measurement device includes a bearing platform, a clamping mechanism, and an image acquisition system. The clamping mechanism is installed on the bearing platform, and the clamping mechanism includes a clamp disposed along a vertical direction. The clamp is configured to clamp the semiconductor structure such that the semiconductor structure is clamped with a to-be-measured surface facing a side. The image acquisition system is disposed by a side of the clamping mechanism, and the image acquisition system is configured to acquire a three-dimensional morphology of the semiconductor structure from the side.

Some further embodiments of the disclosure provide a method for measuring a semiconductor structure. The method includes the following steps. A semiconductor structure is clamped by a clamp of a clamping mechanism. The clamp is disposed along a vertical direction, and a to-be-measured surface of the semiconductor structure faces a side of the clamp. An image acquisition system is disposed by a side of the clamping mechanism, so that the to-be-measured surface of the semiconductor structure is located in an image acquisition area of the image acquisition system. A three-dimensional morphology of the semiconductor structure is acquired by the image acquisition system from the side.

BRIEF DESCRIPTION OF THE DRAWINGS

In order to explain technical solutions in the embodiments of this application or the traditional technology more clearly, drawings required to be used in the description of the embodiments or the traditional technology will be briefly introduced below. It is apparent that the drawings in the description below are only some embodiments of this application. For those of ordinary skill in the art, other drawings may also be obtained based on these drawings without creative work.

DETAILED DESCRIPTION

Figure 1A:
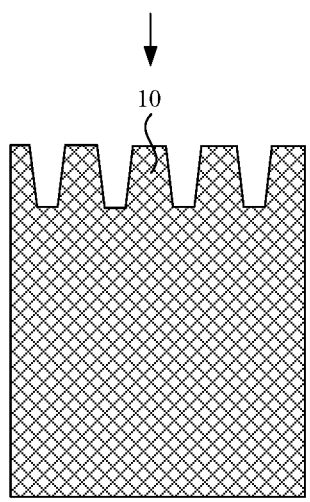
FIG. 1A is a schematic structural diagram of a semiconductor structure in a normal state.

To facilitate understanding this application, this application will be described more comprehensively below with reference to relevant drawings. The drawings show some embodiments of this application. However, this application may be implemented in many different ways and is not limited to the embodiments described herein. Rather, the purpose of providing these embodiments is to make the disclosure of this application more thorough and comprehensive.

Unless otherwise defined, all technical and scientific terms used herein have the same meanings as those commonly understood by those skilled in the technical field of this application. Terms used in the specification of this application herein are only for the purpose of describing specific embodiments and are not intended to limit this application.

It should be understood that, when an element is described as being "on", "adjacent to", "connected to" or "coupled to" other elements, it may be directly on, adjacent to, connected or coupled to the other elements, or there may be intermediate elements. On the contrary, when an element is described as being "directly on", "directly adjacent to", "directly connected to" or "directly coupled to" other elements, no intervening elements or layers are present.

It should be understood that, although terms such as first and second may be used to describe various elements, components or regions, these elements, components or regions should not be limited by these terms. These terms are only used to distinguish one element, component or region from another element, component or region. Therefore, the first element, component or region discussed below may be represented as a second element, component or region, without departing from the teachings of this application.

Spatial relationship terms such as "underneath", "under", "lower", "below", "above", "upper", etc., may be used herein to describe the relationship between an element or feature shown in the figure and other elements or features. It should be understood that, in addition to the orientations shown in the figures, the spatial relationship terms also include different orientations of devices in use and operation. For example, if the device in the drawings is reversed, an element or feature described as "under" or "below" or "underneath" other elements will be oriented "above" the other elements or features. Therefore, the exemplary terms "under" and "below" may include an upper orientation and a lower orientation. In addition, the device may also include other orientations (for example, rotating 90 degrees or other orientations), and the spatial descriptors used here are explained accordingly.

As used herein, singular forms of "a/an", "one" and "said/the" may also include plural forms, unless the context clearly indicates otherwise. It should further be understood that terms "comprise/include" or "have" and the like specify the presence of the stated features, wholes, steps, operations, components, parts or combinations thereof, but do not exclude the possibility of the presence or addition of one or more other features, wholes, steps, operations, components, parts or combinations thereof. Meanwhile, in this specification, a term "and/or" means any and all combinations of related listed items are included.

The embodiments of the disclosure are described here with reference to a cross-sectional view which is a schematic diagram of an ideal embodiment (and an intermediate structure) of this application, so that changes in the shape shown due to, for example, the manufacturing technology and/or tolerances may be expected. Therefore, the embodiments of this application should not be limited to specific shapes of regions shown here, but include shape deviations due to, for example, the manufacturing technology. The regions shown in the figures are illustrative in nature, and their shapes do not represent actual shapes of the regions of the device, and do not limit the scope of the disclosure.

With the development of the semiconductor integrated circuit manufacturing industry, the critical dimension of the semiconductor structure in the semiconductor manufacturing process becomes smaller and smaller, and more device structure parameters need to be controlled. Based on many advantages of the OCD measurement technology, such as non-contact, non-destructive, simultaneous measurement of a plurality of process characteristics, and on-line measurement of a process, the OCD measurement technology is applied widely in the semiconductor manufacturing industry.

Currently, in the process of measurement using the OCD measurement technology, the theoretical spectrum based on model fitting may be obtained by calculating with methods such as a Rigorous Coupled-Wave Analysis (RCWA). The measured spectrum of the to-be-measured surface of the semiconductor structure may be obtained by the OCD measurement device. Since the three-dimensional topography of the to-be-measured surface of the semiconductor structure is finally determined based on the coupling and matching degree of the theoretical spectrum and the measured spectrum, the measurement accuracy of the three-dimensional topography of the semiconductor structure depends on the accuracy of the measured spectrum.

Figure 1B:
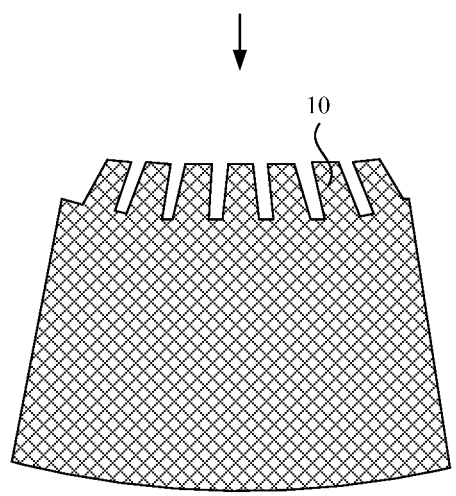
FIG. 1B is a schematic structural diagram of a semiconductor structure in a micro deformation state.

For example, a semiconductor structure (for example, a wafer with a plurality of array units provided on the surface) placed on a machine table of the OCD measurement device along the horizontal direction may be measured by the OCD measurement device. However, with the further reduction in a dimension of an array unit in the semiconductor structure, a dimension of a single feature (such as line width, aspect ratio, etc.) constituting the array unit is also decreasing, so that the measured spectrum obtained by the OCD measurement device tends to include micro deformation information of the single feature. As a result, the measurement accuracy of the OCD measurement device is affected by the micro deformation of the single feature in the array unit. For example, when the semiconductor structure is horizontally placed on the machine table, the semiconductor structure is prone to warping with a sinking center and an upturned edge, leading to the micro deformation of the single feature in the array unit, as shown in FIG. 1A and FIG. 1B. FIG. 1A shows a normal state of a single feature 10 in a semiconductor structure, and FIG. 1B shows a micro deformation state of the single feature 10 in the semiconductor structure. Thus, when measurement is performed by the OCD measurement device over the semiconductor structure, the warping of the semiconductor structure will cause difference between an actual optical path length and a theoretical optical path length of a measured optical signal. This results in that the measured spectrum obtained by the OCD measurement device above the semiconductor structure contains micro deformation information of the single feature 10. Since the micro deformation information of the single feature 10 is not the information of the semiconductor structure itself, it is difficult to accurately measure the three-dimensional morphology of the semiconductor structure.

Figure 2:
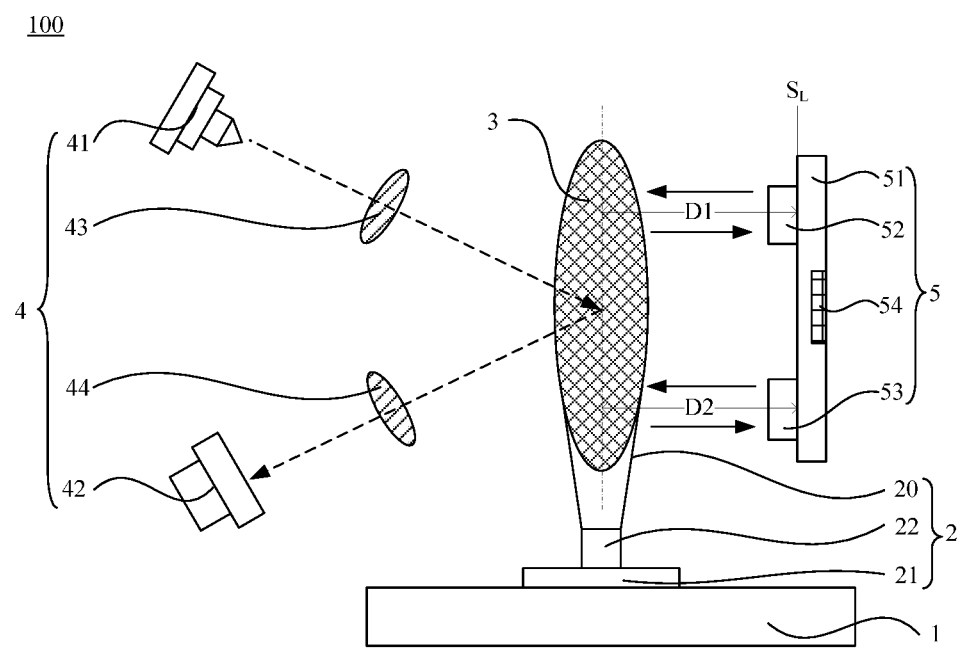
FIG. 2 is a schematic structural diagram of a measurement device for a semiconductor structure provided in an embodiment.

In view of the above, referring to FIG. 2, one embodiment of the disclosure provides a measurement device 100 for a semiconductor structure. The measurement device 100 may reduce or eliminate the influence of gravity on the semiconductor structure, to avoid warping of the semiconductor structure which causes the OCD image inaccurate. The measurement device 100 includes a bearing platform 1, a clamping mechanism 2, and an image acquisition system 4. The clamping mechanism 2 is installed on the bearing platform 1. The clamping mechanism 2 includes a clamp 20 disposed along a vertical direction. The clamp 20 is configured to clamp a semiconductor structure 3 such that the semiconductor structure 3 is clamped with a to-be-measured surface facing a side. The image acquisition system 4 is disposed by a side of the clamping mechanism 2. The image acquisition system 4 is configured to acquire a three-dimensional morphology of the semiconductor structure 3 from the side.

Here, the clamp 20 is disposed along the vertical direction. The side of the clamp 20 or the clamping mechanism 2 refers to its circumferential side. For example, it may be the left side of the clamp 20. The to-be-measured surface of the semiconductor structure 3 facing the side of the clamp 20 represents the semiconductor structure 3 will be placed along the vertical direction. The image acquisition system 4 can measure the to-be-measured surface of the semiconductor structure 3 from the side of the clamp 20.

Reference may be made to FIG. 1A, FIG. 1B, and FIG. 2. In one example, the semiconductor structure 3 is a wafer provided with a plurality of trenches on the surface, that is, a single feature 10 in the semiconductor structure 3 is a trench. A depth $D_1$ of the trench is, for example, 100 nm±10 nm. A total thickness $D_2$ of the wafer is, for example, 800 µm±50 µm. The depth $D_1$ of the trench accounts for approximately 1/8000 of the total thickness $D_2$ of the wafer. Thus, if the wafer is placed horizontally, the wafer is prone to warping under gravity, leading to micro deformation of the trench as shown in FIG. 1B. Compared with the warping arising when the wafer is placed horizontally, in the embodiments of the disclosure, the wafer is vertically clamped by the clamp 20. In this case, the direction of force bearing at a geometric center, an upper edge and a lower edge of the wafer is the same as the direction in which the wafer is placed. As a result, the wafer is prone to maintaining the initial state, to ensure that the trench may not be significantly deformed due to the gravity of the wafer. In this way, the dimension of the trench in the semiconductor structure 3 may be accurately determined based on the measured spectrum of the semiconductor structure 3 acquired by the image acquisition system 4 from the side of the clamp 20.

As can be known from the above, in the embodiments of the disclosure, the clamp 20 in the clamping mechanism 2 is disposed along the vertical direction, so that the to-be-measured surface of the semiconductor structure 3 clamped by the clamp 20 faces the side of the clamp 20, that is, the semiconductor structure 3 may be placed along the vertical direction. In this way, the image acquisition system 4 is disposed by the side of the clamping mechanism 2, and the image acquisition system 4 may acquire the three-dimensional morphology of the semiconductor structure 3 from the side. Since the semiconductor structure 3 clamped by the clamp 20 is placed along the vertical direction, it can be ensured that the direction of gravity is the same as the direction in which the semiconductor structure 3 is placed, to avoid the influence of gravity on the to-be-measured surface of the semiconductor structure 3. Therefore, the measurement device provided by the embodiments of the disclosure may effectively reduce or eliminate the influence of gravity on the three-dimensional morphology of the semiconductor structure 3, to improve the measurement accuracy of the three-dimensional morphology of the semiconductor structure 3.

In the embodiments of the disclosure, the clamping mechanism 2 may have a variety of possible implementations to match various semiconductor structures 3 with different structures and different dimensions.

In a possible implementation, referring to FIG. 3 to FIG. 6, the clamp 20 includes a first clamping ring 201, a second clamping ring 202 and a plurality of adjusting posts 203. The first clamping ring 201 is disposed along the vertical direction. The second clamping ring 202 is disposed along the vertical direction and opposite to the first clamping ring 201. An opposite area between the first clamping ring 201 and the second clamping ring 202 forms a clamping space for clamping the semiconductor structure 3. The plurality of adjusting posts 203 are respectively disposed on the first clamping ring 201 and the second clamping ring 202, and each of the adjusting posts 203 extends toward the clamping space to abut against a surface of the semiconductor structure 3. Thus, both the to-be-measured surface and the back surface of the semiconductor structure 3 may be clamped by the adjusting post 203 in an abutting manner.

The first clamping ring 201 and the second clamping ring 202 each may have a ring structure. An outer diameter and an inner diameter of the ring structure may be determined according to the dimension of the to-be-clamped semiconductor structure 3. Axis lines of the first clamping ring 201 and the second clamping ring 202 are on a same straight line. The first clamping ring 201 and the second clamping ring 202 may be installed on the bearing platform 1 through a fixation frame, or may be disposed on the bearing platform 1 through a movement mechanism with a plurality of movement directions, so as to adjust the position of the clamping mechanism 2 relative to the bearing platform 1 by using the movement mechanism.

The plurality of adjusting posts 203 may be uniformly disposed on the first clamping ring 201 and the second clamping ring 202 to ensure that the force applied on the semiconductor structure 3 is uniform. Moreover, the length extending into the clamping space of the plurality of adjusting posts 203 may be adjusted, and the position of the semiconductor structure 3 may be fine-tuned to ensure that the back surface of the semiconductor structure 3 is perpendicular to the horizontal plane.

Figure 3:
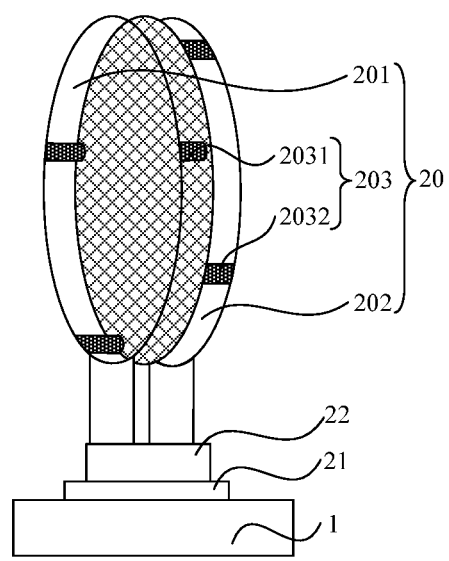
FIG. 3 is a schematic structural diagram of a clamping mechanism provided in an embodiment.
Figure 4:
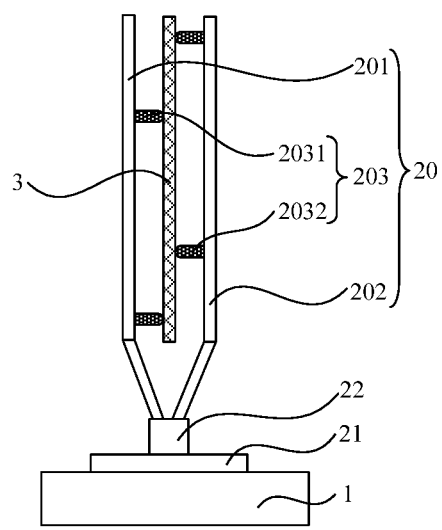
FIG. 4 is a side view of the clamping mechanism shown in FIG. 3.
Figure 5:
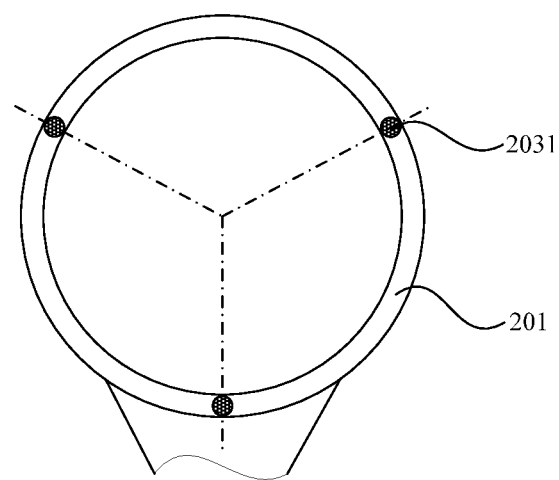
FIG. 5 is a schematic structural diagram of a first clamping ring in the clamping mechanism shown in FIG. 3.

In one example, with reference to FIG. 3 to FIG. 6 again, the plurality of adjusting posts 203 include a plurality of first adjusting posts 2031 and a plurality of second adjusting posts 2032. The plurality of first adjusting posts 2031 are disposed on the first clamping ring 201. Connecting lines between each of the first adjusting posts 2031 and the axis line of the first clamping ring 201 divide 360° equally. The plurality of second adjusting posts 2032 are disposed on the second clamping ring 202. Connecting lines between each of the second adjusting posts 2032 and the axis line of the second clamping ring 202 divide 360° equally. Optionally, the number of the first adjusting posts 2031 and the number of the second adjusting posts 2032 each are greater than or equal to 3, for example, equal to 3.

Figure 6:
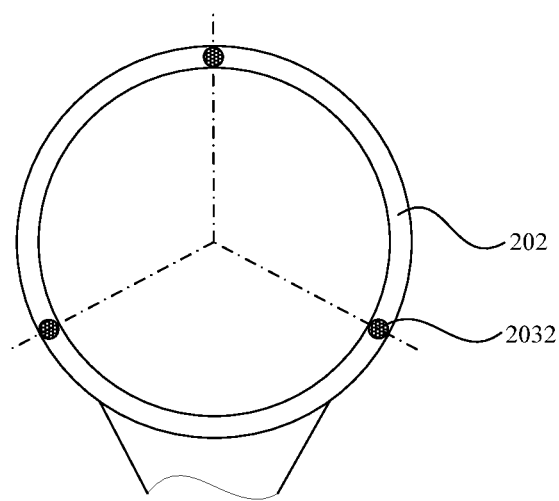
FIG. 6 is a schematic structural diagram of a second clamping ring in the clamping mechanism shown in FIG. 3.

For example, referring to FIG. 5, three first adjusting posts 2031 are provided on the first clamping ring 201. An angle formed by a connecting line between a first adjusting post 2031 and the axis line of the first clamping ring 201 and another connecting line between another first adjusting post 2031 and the axis line of the first clamping ring 201 is or approximately is 120°. Referring to FIG. 6, three second adjusting posts 2032 are disposed on the second clamping ring 202. An angle formed by a connecting line between a second adjusting post 2032 and the axis line of the second clamping ring 202 and another connecting line between another second adjusting post 2032 and the axis line of the second clamping ring 202 is 120°.

In addition, optionally, orthographic projections of the second adjusting posts 2032 on the first clamping ring 201 are alternated with the first adjusting posts 2031. Thus, in a case that the first adjusting posts 2031 and the second adjusting posts 2032 are located on both sides of the semiconductor structure 3 respectively, the first adjusting posts 2031 and the second adjusting posts 2032 are disposed alternately. In this way, the force bearing points of the semiconductor structure 3 may be uniformly distributed, to ensure that a position of the semiconductor structure 3 is maintained stably and evenly.

It can be understood that, in one example, referring to FIG. 2, the measurement device 100 further includes a perpendicularity detection device 5. The perpendicularity detection device 5 is configured to detect a perpendicularity of the back surface of the semiconductor structure 3 relative to a horizontal plane. The back surface is a surface of the semiconductor structure 3 facing away from the to-be-measured surface. In this way, the clamping effect of the semiconductor structure 3 by the clamp 20 may be fed back in time. In a case that the back surface of the semiconductor structure 3 is not perpendicular to the horizontal plane, the position of the semiconductor structure 3 clamped by the clamp 20 may be reasonably adjusted to ensure that the back surface of the semiconductor structure 3 is perpendicular to the horizontal plane. Therefore, it is ensured that the direction of gravity is the same as the direction in which the semiconductor structure 3 is placed, so as to effectively reduce or eliminate the influence of gravity on the three-dimensional topography of the semiconductor structure 3, thereby improving the measurement accuracy of the three-dimensional topography of the semiconductor structure 3.

Referring to FIG. 2 again, optionally, the perpendicularity detection device 5 is disposed by the other side of the clamping mechanism 2. For example, the image acquisition system 4 is located by the left side of the clamping mechanism 2, and the perpendicularity detection device 5 is located by the right side of the clamping mechanism 2. The perpendicularity detection device 5 includes a reference component 51, an upper detector 52, a lower detector 53, and a processor 54.

The reference component 51 has a reference plane perpendicular to the horizontal plane. Here, the reference component 51 is used as a supporting body for the perpendicularity detection device 5, and the structure thereof may be selected and set according to actual requirements. The reference plane may be a side surface of the reference component 51 along the vertical direction, or a virtual vertical plane. For example, the reference plane is a vertical surface SL of the reference component 51 close to the clamping mechanism 2.

The upper detector 52 is disposed at the top of the reference component 51 and configured to detect a first distance D1 from the back surface of the semiconductor structure 3 to the reference plane. The lower detector 53 is disposed at the bottom of the reference component 51 and configured to detect a second distance D2 from the back surface of the semiconductor structure 3 to the reference plane. The upper detector 52 and the lower detector 53 are, for example, optical distance sensors, infrared distance sensors or ultrasonic distance sensors.

The processor 54 may determine the perpendicularity of the back surface of the semiconductor structure 3 relative to the horizontal plane based on a difference between the first distance D1 and the second distance D2. The processor 54 may be integrated inside the reference component 51 or may be provided separately. The processor 54 is connected to the upper detector 52 and the lower detector 53 in signal.

In addition, the upper detector 52 and the lower detector 53 may further be configured to detect first and second distances of the clamp 20 relative to the reference plane to determine the perpendicularity of the clamp 20 relative to the horizontal plane, so as to indirectly determine the perpendicularity of the back surface of the semiconductor structure 3 relative to the horizontal plane, which is not limited in the embodiments of the disclosure.

Figure 7:
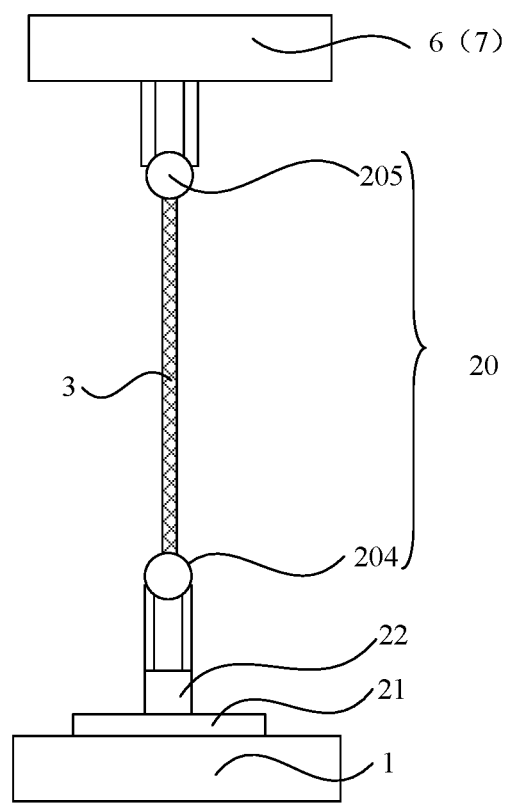
FIG. 7 is a schematic structural diagram of another clamping mechanism provided in an embodiment.

In another possible implementation, referring to FIG. 7, the clamp 20 includes a lower clamping part 204 and an upper clamping part 205. The lower clamping part 204 is disposed on the bearing platform 1 and configured to clamp the bottom of the semiconductor structure 3. The upper clamping part 205 is disposed above the lower clamping part 204 and opposite to the lower clamping part 204 along the vertical direction. The upper clamping part 205 is configured to clamp the top of the semiconductor structure 3. That is, the clamp 20 has a structure with an upper part and a lower part separate from each other which respectively clamp the top and bottom of the semiconductor structure 3.

Here, the structures of the lower clamping part 204 and the upper clamping part 205 may be selected and set according to actual requirements.

Figure 8:
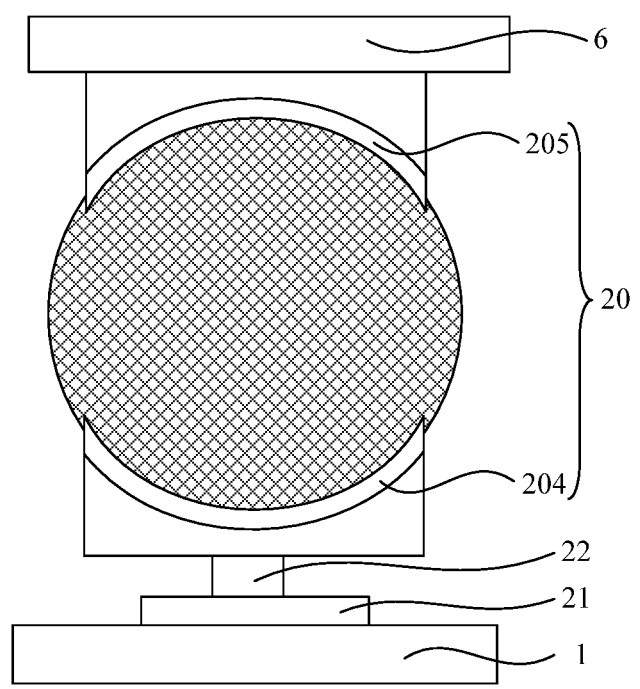
FIG. 8 is a side view of the clamping mechanism shown in FIG. 7.
Figure 9:
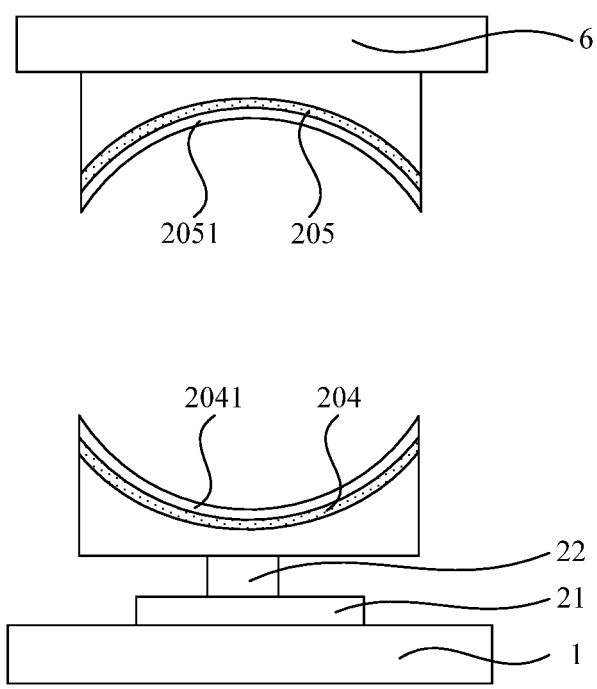
FIG. 9 is a schematic structural diagram of an upper clamping part and a lower clamping part in the clamping mechanism shown in FIG. 8.

In one example, referring to FIG. 8 and FIG. 9, the upper clamping part 205 and the lower clamping part 204 each are provided with an arc-shaped slot. The arc-shaped slot 2051 on the upper clamping part 205 is opposite to the arc-shaped slot 2041 on the lower clamping part 204, and an opposite area is configured to accommodate and receive the semiconductor structure 3. The lower clamping part 204 may be installed on the bearing platform 1 through a fixation frame, or may be disposed on the bearing platform 1 through a movement mechanism with a plurality of movement directions, so as to adjust the position of the lower clamping part 204 relative to the bearing platform 1 by using the movement mechanism. The upper clamping part 205 may be connected to the bearing platform 1 through a lifting mechanism 6. The lifting mechanism 6 is configured to drive the upper clamping part 205 to move along the vertical direction.

In this way, in the process of clamping the semiconductor structure 3 with the clamp 20, the semiconductor structure 3 may be first engaged in the arc-shaped slot 2041 of the lower clamping part 204 along the vertical direction, and then the position of the upper clamping part 205 is adjusted by the lifting mechanism 6, so that the top of the semiconductor structure 3 is engaged in the arc-shaped slot 2051 of the upper clamping part 205. The structure of the lifting mechanism 6 may be selected and set according to actual requirements, which is not limited in the embodiments of the disclosure, as long as it can drive the upper clamping part 205 to move along the vertical direction.

It should be noted that the clamp 20 in the clamping mechanism 2 adopts a different structure, and the corresponding perpendicularity detection device 5 may also adopt other implementations.

Figure 10:
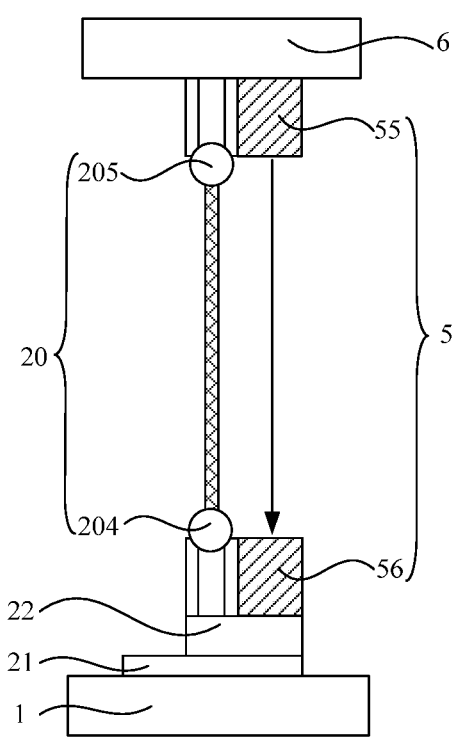
FIG. 10 is a schematic structural diagram of an upper clamping part and a lower clamping part in the other clamping mechanism shown in FIG. 7.

For example, referring to FIG. 10, the perpendicularity detection device 5 is disposed on the clamp 20 of the clamping mechanism 2. The perpendicularity detection device 5 includes a detection light transmitter 55 and a detection light receiver 56. The detection light transmitter 55 is disposed at the top of the clamp 20, for example, on the upper clamping part 205, and configured to emit a detection light signal along the vertical direction. The detection light receiver 56 is disposed at the bottom of the clamp 20, for example, on the lower clamping part 204, and is opposite to the detection light transmitter 55. The detection light receiver 56 is configured to receive the detection light signal, and determine the perpendicularity of the back surface of the semiconductor structure 3 relative to the horizontal plane based on the receiving position of the detection light signal.

Here, the detection light transmitter 55 and the detection light receiver 56 are disposed on the clamp 20, and can directly detect the perpendicularity of the clamp 20 with respect to the horizontal plane. On the basis of that the semiconductor structure 3 is clamped in the clamp 20, for example, engaged in the arc-shaped slot 2051 on the upper clamping part 205 and the arc-shaped slot 2041 on the lower clamping part 204, the perpendicularity of the back surface of the semiconductor structure 3 relative to the horizontal plane may be indirectly determined by the perpendicularity of the clamp 20 relative to the horizontal plane.

Figure 11:
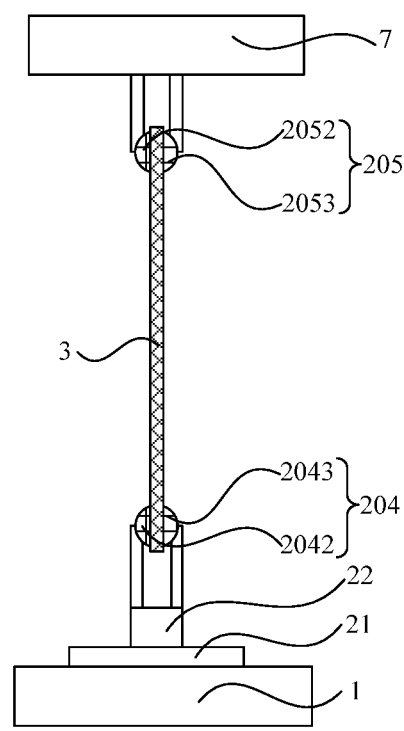
FIG. 11 is a schematic structural diagram of a perpendicularity detection device provided in an embodiment.

In another example, referring to FIG. 11, the upper clamping part 205 and the lower clamping part 204 each include a left suction cup and a right suction cup disposed opposite along the horizontal direction. The left suction cup and the right suction cup are configured to attach to both side surfaces of the semiconductor structure 3. The both side surfaces refer to the to-be-measured surface and the back surface of the semiconductor structure 3.

The lower clamping part 204 may be installed on the bearing platform 1 through a fixation frame, or may be disposed on the bearing platform 1 through a movement mechanism with a plurality of movement directions, so as to adjust the position of the lower clamping part 204 relative to the bearing platform 1 by using the movement mechanism. The upper clamping part 205 may be fixed on a support frame 7. The support frame 7 is located above the bearing platform 1 and may be fixedly connected to the bearing platform 1, or connected to the bearing platform 1 through the lifting mechanism, so that the height of the support frame 7 relative to the bearing platform 1 may be adjusted through the lifting mechanism.

The left suction cup 2052 and the right suction cup 2053 in the upper clamping part 205 may be vacuum suction cups. The left suction cup 2052 and the right suction cup 2053 are disposed on the support frame 7, and the position of the top of the semiconductor structure 3 may be fixed by their suction applied on the top of the semiconductor structure 3. The left suction cup 2042 and the right suction cup 2043 in the lower clamping part 204 may be vacuum suction cups. The left suction cup 2042 and the right suction cup 2043 are disposed on the bearing platform 1, and the position of the bottom of the semiconductor structure 3 may be fixed by their suction applied on the bottom of the semiconductor structure 3. Here, the structure of the vacuum suction cup, the disposing manner of the vacuum suction cup on the support frame 7 or the bearing platform 1, and vacuum equipment (not shown in FIG. 11) required for the operation of the vacuum suction cup may be selected and set according to actual requirements, which are not limited in the embodiments of the disclosure, as long as the semiconductor structure 3 can be attracted and fixed by the vacuum suction cups.

In this way, in the process of clamping the semiconductor structure 3 with the clamp 20, the semiconductor structure 3 may be first placed between the left suction cup 2042 and the right suction cup 2043 of the lower clamping part 204 and between the left suction cup 2052 and the right suction cup 2053 of the upper clamping part 205 along the vertical direction. Then, the bottom of the semiconductor structure 3 is attracted and fixed by the left suction cup 2042 and right suction cup 2043 of the lower clamping part 204, and the top of the semiconductor structure 3 is attracted and fixed by the left suction cup 2052 and the right suction cup 2053 of the upper clamping part 205, so that the back surface of the semiconductor structure 3 is perpendicular to the horizontal plane.

Figure 12:
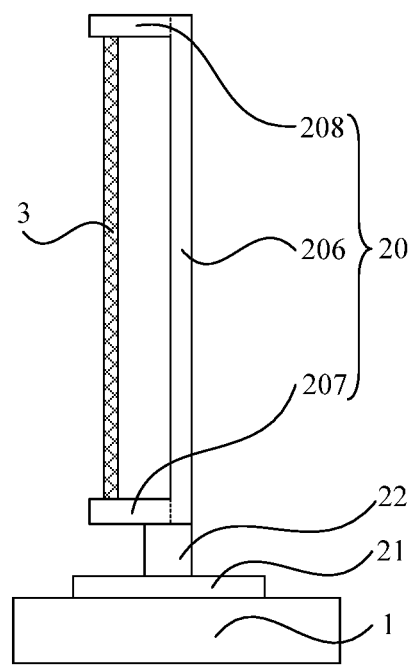
FIG. 12 is a schematic structural diagram of a further clamping mechanism provided in an embodiment.
Figure 13:
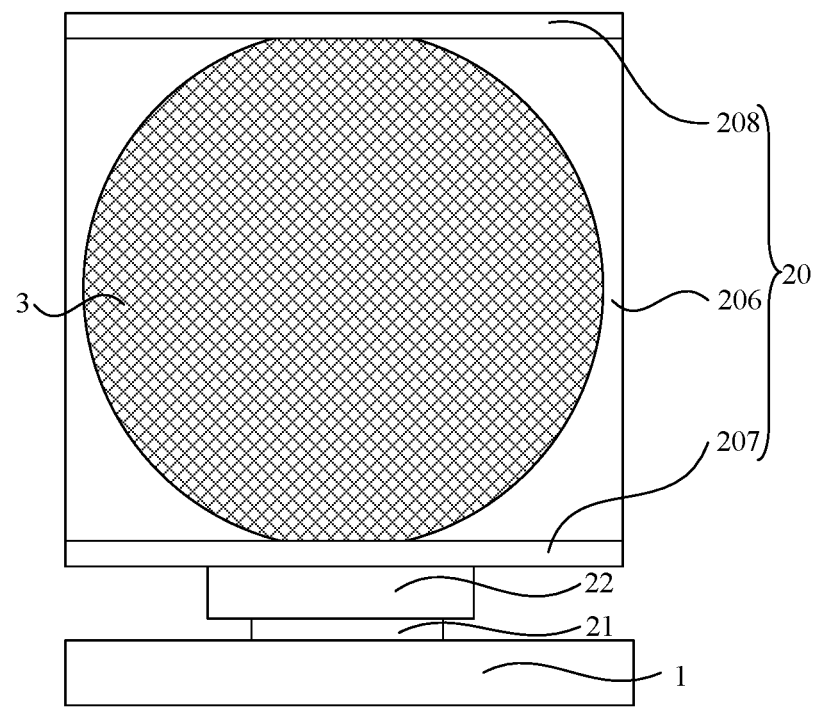
FIG. 13 is a left side view of the clamping mechanism shown in FIG. 12.

In a further possible implementation, referring to FIG. 12 and FIG. 13, the clamp 20 includes a supporting back plate 206, a first clamping part 207 and a second clamping part 208. The supporting back plate 206 is disposed along the vertical direction. The first clamping part 207 is disposed at the bottom of the supporting back plate 206 along the horizontal direction. The second clamping part 208 is disposed at the top of the supporting back plate 206 along the horizontal direction and opposite to the first clamping part 207. An opposite area between the first clamping part 207 and the second clamping part 208 forms a clamping space.

In one example, the first clamping part 207 includes a lower overhang plate and a first positioning groove disposed on the lower overhang plate. The second clamping part 208 includes an upper overhang plate and a second positioning groove disposed on the upper overhang plate. The first positioning groove is opposite to the second positioning groove, and an opposite area between the first positioning groove and the second positioning groove is configured to accommodate and receive the semiconductor structure 3.

Here, the upper overhang plate and the lower overhang plate may be fixedly connected to the supporting back plate 206 or by formed integrally with the supporting back plate 206. An overhang length of the lower overhang plate and the upper overhang plate relative to the supporting back plate 206 may be smaller so that the spacing between the semiconductor structure 3 and the supporting back plate 206 is smaller. The first positioning groove on the lower overhang plate and the second positioning groove on the upper overhang plate may be arc-shaped slots or flat grooves. Moreover, groove depths of the first positioning groove and the second positioning groove may be set as shallow as possible as long as the semiconductor structure 3 can be engaged in them. In this way, in the process of clamping the semiconductor structure 3 with the clamp 20, the semiconductor structure 3 may be first engaged in the first positioning groove of the lower overhang plate along the vertical direction, and then the top of the semiconductor structure 3 may be engaged in the second positioning groove of the upper overhang plate. For example, the thickness of the semiconductor structure 3 is usually smaller. The top of the semiconductor structure 3 may be engaged in the second positioning groove of the upper overhang plate by temporarily bending the top of the semiconductor structure 3 and then restoring to its original shape.

Figure 14:
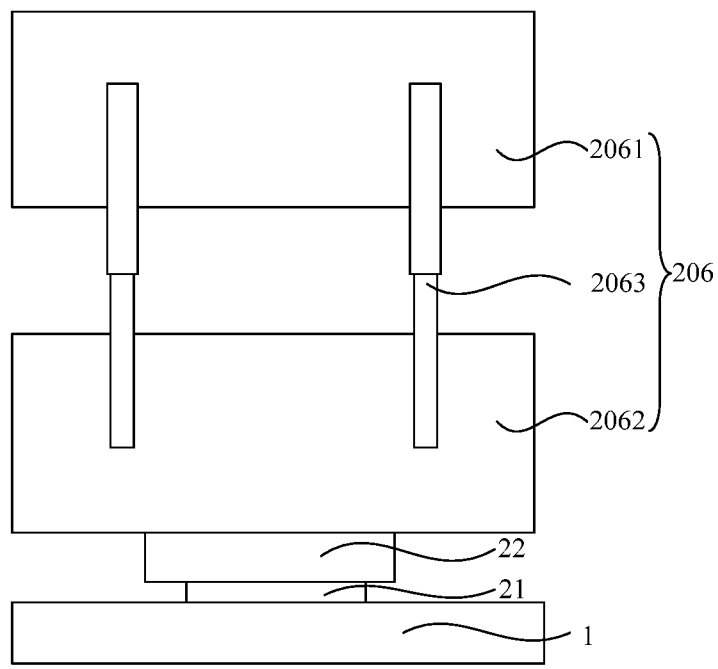
FIG. 14 is a right side view of the clamping mechanism shown in FIG. 12.

Based on the example above, referring to FIG. 14, optionally, the supporting back plate 206 has a separated structure. The supporting back plate 206 includes an upper back plate 2061 and a lower back plate 2062 disposed opposite to each other along the vertical direction. The upper back plate 2061 and the lower back plate 2062 are connected through a telescopic rod assembly 2063. In this way, the vertical distance between the upper back plate 2061 and the lower back plate 2062 may be adjusted accordingly by adjusting a telescopic length of the telescopic rod assembly 2063, to adjust the dimension range of the semiconductor structure 3 that can be clamped.

In some of the embodiments, the clamp 20 may be disposed on the bearing platform 1 through a movement mechanism with a plurality of movement directions, so that the clamping mechanism 2 has a plurality of movement directions.

Figure 15A:
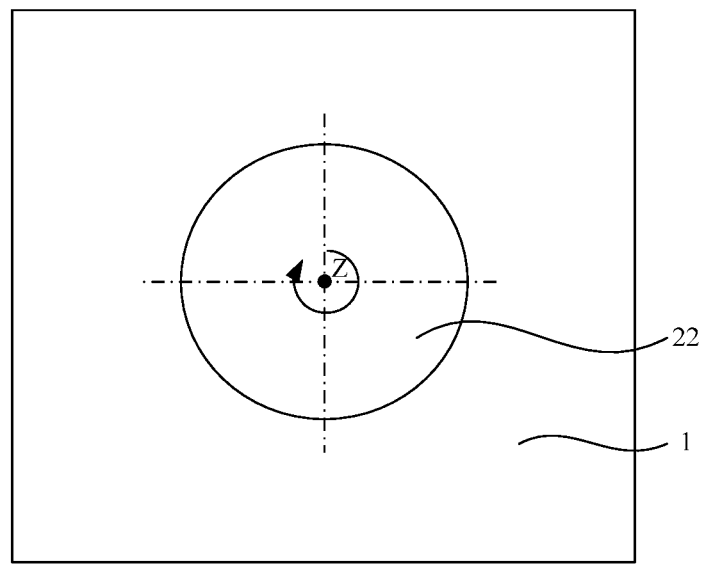
FIG. 15A and FIG. 15B are schematic diagrams of a movement direction of a rotatable base provided in an embodiment.
Figure 15B:
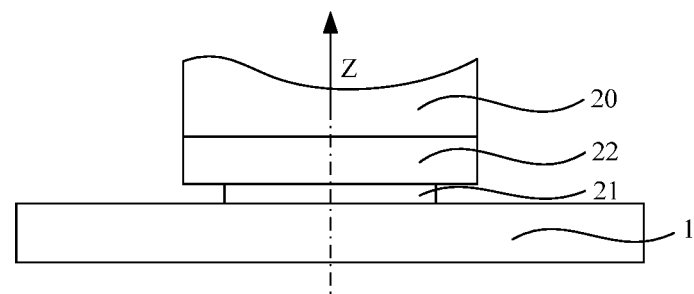

In one example, referring to FIG. 15A and FIG. 15B, the clamp 20 may be disposed on the bearing platform 1 through a rotatable base 22.

As shown in FIG. 15A, the rotatable base 22 may rotate 360° relative to a Z axis to adjust the orientation of the clamp 20 on the bearing platform 1 according to actual requirements, so as to ensure that the to-be-measured surface of the semiconductor structure 3 clamped by the clamp 20 faces or is located in an image acquisition area of the image acquisition system 4.

Optionally, as shown in FIG. 15B, the rotatable base 22 may also be lifted or lowered relative to the bearing platform 1 along a Z-axis direction to drive the clamping mechanism 2 to be lifted or lowered relative to the bearing platform 1 along the Z-axis direction, so as to adjust a height of the clamping mechanism 2 relative to the bearing platform 1, that is, a Z coordinate of the clamping mechanism 2.

The structure of the rotatable base 22 may be selected and set according to actual requirements, such as adopting a rotating joint with an internal lifting structure, which is not limited in the embodiments of the disclosure.

In addition, in one example, the rotatable base 22 is disposed on the bearing platform 1 through a translation mechanism 21.

Figure 16:
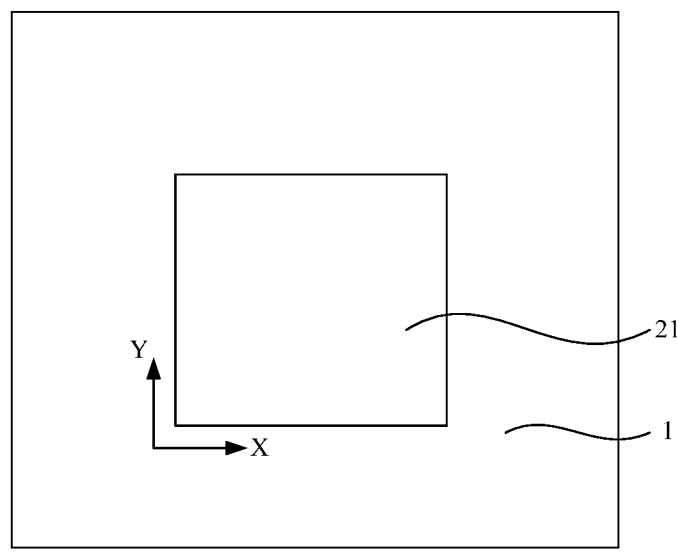
FIG. 16 is a schematic diagram of a movement direction of a translation mechanism provided in an embodiment.

Referring to FIG. 16, the translation mechanism 21 can perform translational movement in at least two directions, such as an X direction and a Y direction, relative to the bearing platform 1 to drive the rotatable base 22 and the clamp 20 to translate relative to the bearing platform 1, so as to adjust the plane position of the clamping mechanism 2 relative to the bearing platform 1, that is, an X coordinate and a Y coordinate of the clamping mechanism 2.

The structure of the translation mechanism 21 may be selected and set according to actual requirements. For example, the translation mechanism 21 adopts a translator, or the translation mechanism 21 and the bearing platform 1 are integrated into an electrically controlled translation table, etc., which is not limited in the embodiments of the disclosure.

As can be known from the above, in the embodiments of the disclosure, the clamping mechanism 2 is connected to the bearing platform 1 through a movement mechanism of the translation mechanism 21 and the rotatable base 22. The position of the clamping mechanism 2, i.e., the position of the semiconductor structure 3, may be accurately adjusted by using the translation mechanism 21 and the rotatable base 22, to ensure that the to-be-measured surface of the semiconductor structure 3 may be located in the image acquisition area of the image acquisition system 4.

In some of the embodiments, the image acquisition system 4 is configured to acquire a three-dimensional morphology of the semiconductor structure 3 from the side of the clamp 20, and the structure of the image acquisition system 4 may be selected and set according to actual requirements.

For example, referring to FIG. 2, the image acquisition system 4 includes a light source 41 and an imaging light receiver 42. The light source 41 is configured to emit an imaging light signal to the to-be-measured surface of the semiconductor structure 3. The imaging light receiver 42 is configured to receive a reflected light signal formed from the imaging light signal irradiated to the to-be-measured surface of the semiconductor structure 3, and output the three-dimensional morphology of the semiconductor structure 3 based on the reflected light signal.

Here, the light source 41 is, for example, an elliptically polarized light source, a white light source, an infrared light source or an ultraviolet light source, etc. An incident angle of the imaging light signal emitted from the light source 41 incident on the semiconductor structure 3 is, for example, a Brewster angle, or a 90° angle, etc., but is not limited thereto.

Optionally, referring to FIG. 2 again, the image acquisition system 4 further includes a first optical element 43 disposed between the light source 41 and the semiconductor structure 3, and a second optical element 44 disposed between the imaging light receiver 42 and the semiconductor structure 3. The first optical element 43 may perform optical processing on the imaging light signal incident on the semiconductor structure 3, and the second optical element 44 may perform optical processing on the reflected light signal to be received by the imaging light receiver 42.

Here, the first optical element 43 and the second optical element 44 may be set according to actual requirements. For example, the light source 41 is an elliptically polarized light source, the first optical element 43 is a polarizer, and the second optical element 44 is a polarization analyzer.

Figure 17:
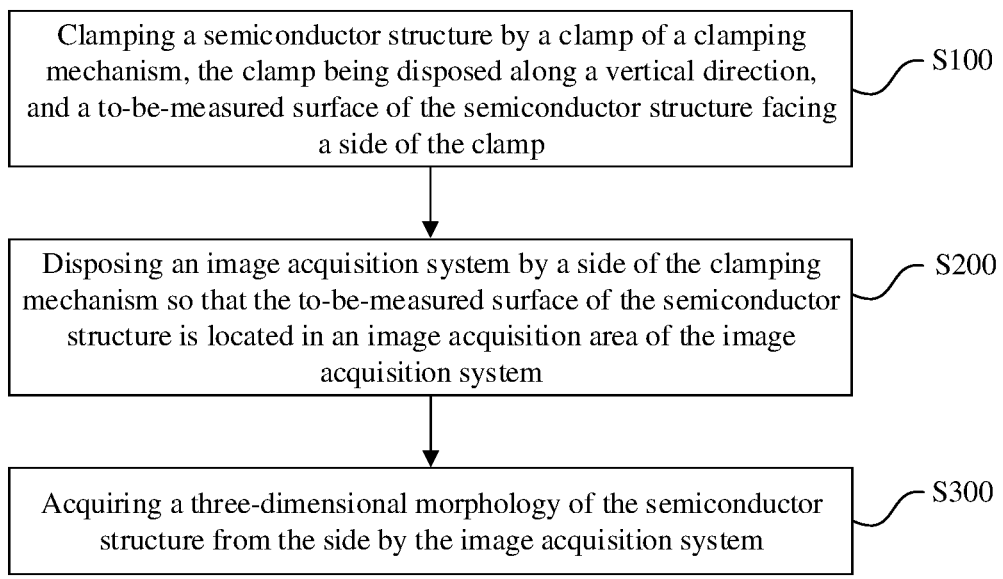
FIG. 17 is a flowchart of a method for measuring a semiconductor structure provided in an embodiment.

One embodiment of the disclosure further provides a method for measuring a semiconductor structure. Referring to FIG. 17, the method includes the following steps.

At S100, a semiconductor structure is clamped by a clamp of a clamping mechanism. The clamp is disposed along a vertical direction, and a to-be-measured surface of the semiconductor structure faces a side of the clamp.

Here, the to-be-measured surface of the semiconductor structure faces the side of the clamp, which means that the semiconductor structure is placed along the vertical direction, so that the image acquisition system can subsequently measure the to-be-measured surface of the semiconductor structure along a horizontal direction.

In addition, according to different structures of the clamps, the way in which the clamp clamps the semiconductor structure is also different. For the structure of the clamp and the way in which the clamp clamps the semiconductor structure, reference may be made to the relevant description in some of the foregoing embodiments, which will not be repeated here.

At S200, an image acquisition system is disposed by a side of the clamping mechanism so that the to-be-measured surface of the semiconductor structure is located in an image acquisition area of the image acquisition system.

At S300, a three-dimensional morphology of the semiconductor structure is acquired by the image acquisition system.

In the embodiments of the disclosure, the clamp is disposed along the vertical direction, so that the to-be-measured surface of the semiconductor structure clamped by the clamp faces the side of the clamp. That is, the semiconductor structure may be placed along the vertical direction. On this basis, the image acquisition system is disposed by the side of the clamping mechanism, and the image acquisition system can acquire the three-dimensional morphology of the semiconductor structure from the side. Thus, the semiconductor structure clamped by the clamp is placed along the vertical direction. It can be ensured that the direction of gravity is the same as the direction in which the semiconductor structure is placed, so as to avoid the influence of gravity on the to-be-measured surface of the semiconductor structure. This may further effectively reduce or eliminate the influence of gravity on the three-dimensional morphology of the semiconductor structure, to improve the measurement accuracy of the three-dimensional morphology of the semiconductor structure.

In one embodiment, the clamping mechanism has a plurality of movement directions. For example, the clamp is disposed on the bearing platform through a movement mechanism having a plurality of movement directions. Thus, in a case that the position of the image acquisition system remains unchanged, the to-be-measured surface of the semiconductor structure may be located in the image acquisition area of the image acquisition system by adjusting the position of the clamp.

For example, referring to FIG. 15A, FIG. 15B and FIG. 16, the clamp 20 is disposed on the rotatable base 22, and the rotatable base 22 is disposed on the bearing platform 1 through the translation mechanism 21. In this way, the clamp 20 clamping the semiconductor structure 3 may be moved in an X-Y plane by using the translation function of the translation mechanism 21. The clamp 20 clamping the semiconductor structure 3 may be rotated towards the image acquisition system 4 by using the rotation function of the rotatable base 22. The clamp 20 clamping the semiconductor structure 3 may be lifted and lowered along the Z-axis direction by using the lifting function of the rotatable base 22. Thus, the three-dimensional coordinates (X, Y, Z) of the semiconductor structure 3 can be adjusted.

In addition, the position of the semiconductor structure 3 may also be fine-tuned by using the clamp 20. For example, the structure of the clamp 20 is as shown in FIG. 3, so that the position of the semiconductor structure 3 may be fine-tuned by adjusting the length of the adjusting post 203 extending into the clamping area, to ensure that the back surface of the semiconductor structure 3 is perpendicular to the horizontal plane.

Figure 18:
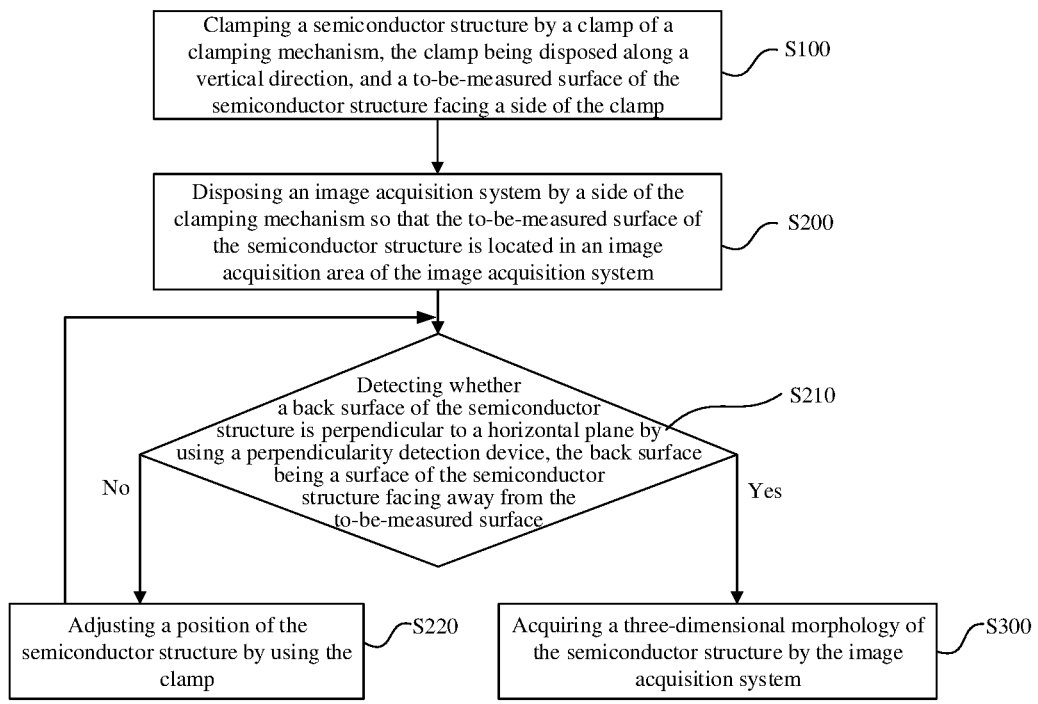
FIG. 18 is a flowchart of another method for measuring a semiconductor structure provided in an embodiment.

In one embodiment, referring to FIG. 18, before performing S300, the method further includes the following steps.

At S210, whether a back surface of the semiconductor structure is perpendicular to a horizontal plane is detected by a perpendicularity detection device, the back surface being a surface of the semiconductor structure facing away from the to-be-measured surface. If yes, step S300 is performed.

At S220, if not, the position of the semiconductor structure is adjusted by the clamp so that the back surface of the semiconductor structure is perpendicular to the horizontal plane. Then, S210 is returned to.

Here, the structure of the perpendicularity detection device is different, and its detection method for the perpendicularity of the semiconductor structure relative to the horizontal plane is also different.

Optionally, it can be understood with reference to FIG. 2 and FIG. 18 that the image acquisition system 4 is located by the left side of the clamping mechanism 2 and the perpendicularity detection device 5 is located by the right side of the clamping mechanism 2. The perpendicularity detection device 5 includes a reference component 51, an upper detector 52, a lower detector 53, and a processor 54. Thus, the upper detector 52 is utilized to detect a first distance D1 from the back surface of the semiconductor structure 3 to the reference plane, and the lower detector 53 is utilized to detect a second distance D2 from the back surface of the semiconductor structure 3 to the reference plane, so that the processor 54 may determine the perpendicularity of the back surface of the semiconductor structure 3 relative to the horizontal plane according to a difference between the first distance D1 and the second distance D2. In addition, the upper detector 52 and the lower detector 53 may further be configured to detect first and second distances of the clamp 20 relative to the reference plane to determine a perpendicularity of the clamp 20 relative to the horizontal plane, so as to indirectly determine the perpendicularity of the back surface of the semiconductor structure 3 relative to the horizontal plane, which is not limited in the embodiments of the disclosure.

Optionally, it can be understood with reference to FIG. 10 and FIG. 18 that the perpendicularity detection device 5 is disposed on the clamp 20 of the clamping mechanism 2. The perpendicularity detection device 5 includes a detection light transmitter 55 and a detection light receiver 56. After the detection light transmitter 55 emits a detection light signal along the vertical direction, the detection light receiver 56 can receive the detection light signal, and determine the perpendicularity of the back surface of the semiconductor structure 3 relative to the horizontal plane based on the receiving position of the detection light signal.

In the embodiments of the disclosure, the clamping effect of the semiconductor structure by the clamp may be fed back in time, by using the perpendicularity detection device to detect the perpendicularity of the semiconductor structure relative to the horizontal plane. In a case that the back surface of the semiconductor structure is not perpendicular to the horizontal plane, the clamping position of the semiconductor structure by the clamp can be reasonably adjusted to ensure that the back surface of the semiconductor structure is perpendicular to the horizontal plane. Therefore, it is ensured that the direction of gravity is the same as the direction in which the semiconductor structure is placed, so as to effectively reduce or eliminate the influence of gravity on the three-dimensional topography of the semiconductor structure, thereby improving the measurement accuracy of the three-dimensional topography of the semiconductor structure.

The technical features of the embodiments above may be combined arbitrarily. Not all possible combinations of the technical features of the embodiments above are described for the sake of brevity. However, provided that there is no contradiction in the combination of these technical features, such combinations should be regarded as the scope described in this specification.

The embodiments above only show several implementations of this application, and the description thereof is specific and detailed, but it cannot be construed as limitations to the scope of the patent application. It should be noted that for those skilled in the art, a plurality of modifications and improvements may be made without departing from the concept of this disclosure, which all fall within the protection scope of this disclosure. Therefore, the protection scope of this patent application shall only be interpreted by the appended claims.

The invention claimed is:

1. A measurement device for a semiconductor structure, comprising:
 a bearing platform;
 a clamping mechanism installed on the bearing platform and comprising a clamp disposed along a vertical direction, the clamp being configured to clamp the semiconductor structure such that the semiconductor structure is clamped with a to-be-measured surface facing a side of the clamping mechanism;

a perpendicularity detection device, configured to detect a perpendicularity of a back surface of the semiconductor structure relative to a horizontal plane, wherein the back surface is a surface of the semiconductor structure facing away from the to-be-measured surface, and wherein the clamp is configured to: in response to the back surface of the semiconductor structure being not perpendicular to the horizontal plane, adjust a position of the semiconductor structure clamped by the clamp so that the back surface of the semiconductor structure is perpendicular to the horizontal plane; and an image acquisition system disposed by the side of the clamping mechanism and configured to acquire a three-dimensional morphology of the semiconductor structure from the side.

2. The measurement device of claim 1, wherein the clamp comprises:

a first clamping ring disposed along the vertical direction;

a second clamping ring disposed along the vertical direction and opposite to the first clamping ring, an opposite area between the first clamping ring and the second clamping ring forming a clamping space; and a plurality of adjusting posts respectively disposed on the first clamping ring and the second clamping ring and extending toward the clamping space to abut against a surface of the semiconductor structure.

3. The measurement device of claim 2, wherein the plurality of adjusting posts comprise:

a plurality of first adjusting posts disposed on the first clamping ring, a connecting line between each of the first adjusting posts and an axis line of the first clamping ring dividing 360° equally; and a plurality of second adjusting posts disposed on the second clamping ring, a connecting line between each of the second adjusting posts and an axis line of the second clamping ring dividing 360° equally.

4. The measurement device of claim 3, wherein orthographic projections of the second adjusting posts on the first clamping ring are alternated with the first adjusting posts.

5. The measurement device of claim 1, wherein the clamp comprises:

a lower clamping part disposed on the bearing platform and configured to clamp a bottom of the semiconductor structure; and an upper clamping part disposed above the lower clamping part and opposite to the lower clamping part in the vertical direction, the upper clamping part being configured to clamp a top of the semiconductor structure.

6. The measurement device of claim 5, wherein, the upper clamping part and the lower clamping part each are provided with an arc-shaped slot; the arc-shaped slot on the upper clamping part is opposite to the arc-shaped slot on the lower clamping part, and an opposite area is configured to accommodate and receive the semiconductor structure; and the upper clamping part is connected to the bearing platform through a lifting mechanism, and the lifting mechanism is configured to drive the upper clamping part to move along the vertical direction.

7. The measurement device of claim 5, wherein, the upper clamping part and the lower clamping part each comprise a left suction cup and a right suction cup opposite to each other in a horizontal direction; and the left suction cup and the right suction cup are configured to attach to both side surfaces of the semiconductor structure.

8. The measurement device of claim 1, wherein the clamp comprises:

a supporting back plate disposed along the vertical direction;

a first clamping part disposed at a bottom of the supporting back plate along a horizontal direction; and a second clamping part disposed at a top of the supporting back plate along the horizontal direction and opposite to the first clamping part, an opposite area between the first clamping part and the second clamping part forming a clamping space.

9. The measurement device of claim 8, wherein, the first clamping part comprises a lower overhang plate and a first positioning groove disposed on the lower overhang plate;

the second clamping part comprises an upper overhang plate and a second positioning groove disposed on the upper overhang plate; and the first positioning groove is opposite to the second positioning groove, and a second opposite area between the first positioning groove and the second positioning groove is configured to accommodate and receive the semiconductor structure.

10. The measurement device of claim 1, wherein the clamping mechanism has a plurality of movement directions.

11. The measurement device of claim 1, wherein the perpendicularity detection device is disposed by another side of the clamping mechanism, and the perpendicularity detection device comprises:

a reference component having a reference plane perpendicular to the horizontal plane;

an upper detector disposed at a top of the reference component and configured to detect a first distance from the back surface of the semiconductor structure to the reference plane;

a lower detector disposed at a bottom of the reference component and configured to detect a second distance from the back surface of the semiconductor structure to the reference plane; and a processor configured to determine the perpendicularity of the back surface of the semiconductor structure relative to the horizontal plane based on a difference between the first distance and the second distance.

12. The measurement device of claim 1, wherein the perpendicularity detection device is disposed on the clamping mechanism, and the perpendicularity detection device comprises:

a detection light transmitter disposed at a top of the clamp and configured to emit a detection light signal along the vertical direction; and a detection light receiver disposed at a bottom of the clamp and opposite to the detection light transmitter, and configured to receive the detection light signal and determine the perpendicularity of the back surface of the semiconductor structure relative to the horizontal plane based on a receiving position of the detection light signal.

13. The measurement device of claim 1, wherein the image acquisition system comprises:

a light source configured to emit an imaging light signal to the to-be-measured surface of the semiconductor structure; and an imaging light receiver configured to receive a reflected light signal formed from the imaging light signal irradiated to the to-be-measured surface, and output the three-dimensional morphology of the semiconductor structure based on the reflected light signal.

14. A method for measuring a semiconductor structure, comprising:
clamping the semiconductor structure by a clamp of a clamping mechanism, the clamp being disposed in a vertical direction, and a to-be-measured surface of the semiconductor structure facing a side of the clamping mechanism;
disposing an image acquisition system by the side of the clamping mechanism so that the to-be-measured surface of the semiconductor structure is located in an image acquisition area of the image acquisition system;
detecting whether a back surface of the semiconductor structure is perpendicular to a horizontal plane by using a perpendicularity detection device, wherein the back surface is a surface of the semiconductor structure facing away from the to-be-measured surface;
in response to the back surface of the semiconductor structure being not perpendicular to the horizontal plane, adjusting a position of the semiconductor structure by using the clamp, so that the back surface of the semiconductor structure is perpendicular to the horizontal plane; and
acquiring a three-dimensional morphology of the semiconductor structure from the side by the image acquisition system.

* * * * *